US009837275B2

(12) United States Patent
Wang et al.

(10) Patent No.: US 9,837,275 B2
(45) Date of Patent: Dec. 5, 2017

(54) FABRICATION METHOD OF FAST RECOVERY DIODE

(71) Applicant: SHANGHAI IC R&D CENTER CO., LTD., Shanghai (CN)

(72) Inventors: Quan Wang, Shanghai (CN); Jieqiong Dong, Shanghai (CN); Deming Sun, Shanghai (CN); Wei Zhou, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 202 days.

(21) Appl. No.: 14/901,064

(22) PCT Filed: Dec. 10, 2013

(86) PCT No.: PCT/CN2013/088928
§ 371 (c)(1),
(2) Date: Dec. 28, 2015

(87) PCT Pub. No.: WO2015/035718
PCT Pub. Date: Mar. 19, 2015

(65) Prior Publication Data
US 2017/0323793 A1    Nov. 9, 2017

(30) Foreign Application Priority Data

Sep. 13, 2013  (CN) .......................... 2013 1 0419510

(51) Int. Cl.
*H01L 29/06* (2006.01)
*H01L 21/265* (2006.01)
(Continued)

(52) U.S. Cl.
CPC .... *H01L 21/26513* (2013.01); *H01L 29/0619* (2013.01); *H01L 29/66136* (2013.01); *H01L 29/8611* (2013.01)

(58) Field of Classification Search
None
See application file for complete search history.

(56) References Cited

U.S. PATENT DOCUMENTS 5,552,625 A * 9/1996 Murakami .......... H01L 29/0626
257/409
6,441,455 B1 * 8/2002 Dutta ................. H01L 29/0619
257/490

(Continued)

FOREIGN PATENT DOCUMENTS

CN    102842501 A  * 12/2012
CN    103178120 A  *  6/2013

(Continued)

*Primary Examiner* — Charles Garber
*Assistant Examiner* — Alia Sabur
(74) *Attorney, Agent, or Firm* — Tianchen LLC.

(57) ABSTRACT

This invention involves a fabrication method of fast recovery diode, which includes following steps: growing a sacrificial oxide layer on a surface of an N– substrate; forming a P type doped field-limiting ring region on the substrate; forming a P type doped anode region on the substrate; removing the sacrificial oxide layer; annealing the substrate to form a PN junction; implanting oxygen into the surface of the substrate by ion implantation; annealing the substrate to form a silicon dioxide layer on the surface of the substrate; removing the silicon dioxide layer; forming an anode electrode and a cathode electrode of the fast recovery diode. The method eliminates the curved parts near the silicon surface of the profile of PN junction, decreases electric field intensity at the surface of the substrate, therefore increases the breakdown voltage and reliability of the fast recovery diode.

10 Claims, 5 Drawing Sheets

(51) Int. Cl.
*H01L 29/66* (2006.01)
*H01L 29/861* (2006.01)

(56) References Cited

U.S. PATENT DOCUMENTS

| | | | | |
|---|---|---|---|---|
| 6,753,580 B1* | 6/2004 | Francis | ............. | H01L 29/66136 257/367 |
| 2008/0164554 A1* | 7/2008 | Itzler | ................... | H01L 31/1075 257/438 |
| 2013/0221403 A1* | 8/2013 | Lu | ........................ | H01L 21/761 257/139 |
| 2014/0367737 A1* | 12/2014 | Takahashi | ........... | H01L 29/0615 257/139 |
| 2015/0303268 A1* | 10/2015 | Ishimaru | ............. | H01L 21/2253 363/37 |
| 2016/0380072 A1* | 12/2016 | Zhong | ................... | H01L 29/404 257/139 |

FOREIGN PATENT DOCUMENTS

| CN | 102522335 B | * | 10/2014 |
|---|---|---|---|
| CN | 102569067 B | * | 11/2014 |

* cited by examiner

--Prior Art--

FABRICATION METHOD OF FAST RECOVERY DIODE

CROSS-REFERENCE TO RELATED APPLICATION

The application claims the priority benefit of International Patent Application Serial No. PCT/CN2013/088928, filed Dec. 10, 2013, which is related to and claims the priority benefit of China patent application serial No. 201310419510.8 filed Sep. 13, 2013. The entirety of each of the above-mentioned patent applications is hereby incorporated by reference herein and made a part of the specification.

FIELD OF THE INVENTION

The present invention generally relates to the field of semiconductor manufacturing technology, more particularly, to a fabrication method of fast recovery diode.

BACKGROUND OF THE INVENTION

Fast recovery diode (FRD) is a kind of semiconductor diode with good switching characteristics and short reverse recovery time. It is mainly used as a high frequency rectifier diode, a freewheeling diode, or a damping diode in electronic circuits, such as a switching power supply, a PWM (pulse width modulator), or a frequency converter. The internal structure of the fast recovery diode is different from that of the ordinary PN junction diodes, the fast recovery diode belongs to a PIN junction diode. In other words, a base region I is added between P type silicon material and N type silicon material to form a PIN device. Because the base region I is very thin, the reverse recovery charge is very small, therefore, the reverse recovery time of the fast recovery diode is relatively short, the forward voltage drop of the fast recovery diode is relatively low, the reverse breakdown voltage (withstand voltage value) of the fast recovery diode is relatively high.

With the rapid development of the power devices such as IGBTs, the FRD device which is used with the IGBTs is becoming an indispensable device in power electronic systems. To the FRD power device that is used with high voltage IGBTs, its reverse breakdown voltage is as important as its reverse recovery characteristic and forward voltage drop, moreover, the breakdown voltage of the FRD device is lower than the breakdown voltage of the IGBTs would damage the IGBT devices in module.

FIG. 1 is a structural schematic diagram illustrating a fast recovery diode in the prior art, the device includes: a N– substrate 10, a P type doped field-limiting ring region 101, a P type doped anode region 102, a back implanted N+ doped region 103, a field oxide 40, and a first metal layer 50 and a second metal layers 60; wherein, the field-limiting ring region 101 and the anode region 102 are formed by doping on the N– substrate, the field oxide 40 grows on the surface of the substrate, the first metal layer 50 is deposited on the field oxide 40, and is finally formed as an anode electrode of the fast recovery diode, the N+ doped region 103 is formed on the backside of the substrate 10, the second metal layer 60 is deposited on the N+ doped region 103, and is formed as a cathode electrode.

The device structure adopts the field-limiting ring (FLR) and the field plate (FP) technology to increase the breakdown voltage of the FRD device. However in its fabrication process, a conventional planar process is adopted, by ion implantation and then annealing the field-limiting ring region 101 and the anode region 102 to form PN junction. The profile of the PN junction after the annealing process is shown in FIG. 1. As shown, curved parts 70 formed near the silicon surface, such curved parts 70 would make the curvature radius of the PN junction smaller, which would cause an accumulation of electric field at the curved parts, and a breakdown is likely to occur. This would result in a lower breakdown voltage and a poor reliability of the FRD device.

Therefore, the technical problem that the present invention needs to solve is to avoid the appearance of curved parts in the profile of the PN junction, so as to increase the breakdown voltage of the FRD device.

BRIEF SUMMARY OF THE DISCLOSURE

The present invention aims to provide a fabrication method of fast recovery diode, which can avoid the appearance of curved parts in the PN junction profile.

To achieve the purpose above, the technical scheme is as follows:

A fabrication method of fast recovery diode includes following steps: a) growing a sacrificial oxide layer on a surface of an N– substrate; b) forming a P type doped field-limiting ring region on the substrate; c) forming a P type doped anode region on the substrate; d) removing the sacrificial oxide layer; e) annealing the substrate to form a PN junction; f) implanting oxygen into the surface of the substrate by ion implantation; g) annealing the substrate to form a silicon dioxide layer on the surface of the substrate; h) removing the silicon dioxide layer; i) forming an anode electrode and a cathode electrode of the fast recovery diode.

Preferably, in Step f), the implant dose of the oxygen is between 1e18/cm$^2$ and 1e19/cm$^2$, the implant energy of the oxygen is between 15 KeV and 150 KeV.

Preferably, in Step g), the annealing temperature is in a range of 600 degrees Celsius to 1300 degrees Celsius.

Preferably, the Step b) specifically includes: defining a pattern of the field-limiting ring region on the substrate by performing a lithography process, then performing a boron ion implantation process, removing the photoresist, so as to form the P type doped field-limiting ring region.

Preferably, the Step c) specifically includes: defining a pattern of the anode region on the substrate by performing a lithography process, then performing a boron ion implantation process, removing the photoresist, so as to form the P type doped anode region.

The present invention provides the fabrication method of the fast recovery diode, in its fabrication process, by steps such as implanting oxygen into the surface of the substrate, annealing the substrate to form a silicon dioxide layer on the surface of the substrate, and removing the silicon dioxide layer etc., the curved parts near the silicon surface of the profile of PN junction would be eliminated, the electric field intensity at this place would be decreased, which would result in an higher breakdown voltage, therefore the reliability of the FRD device would be improved. This fabrication method is simple in operation, and easy to facilitate popularization and application in the industry.

DETAILED DESCRIPTION OF THE EMBODIMENTS

The embodiments of the present invention will now be described more fully hereinafter with reference to the accompanying drawings.

Figure 1:
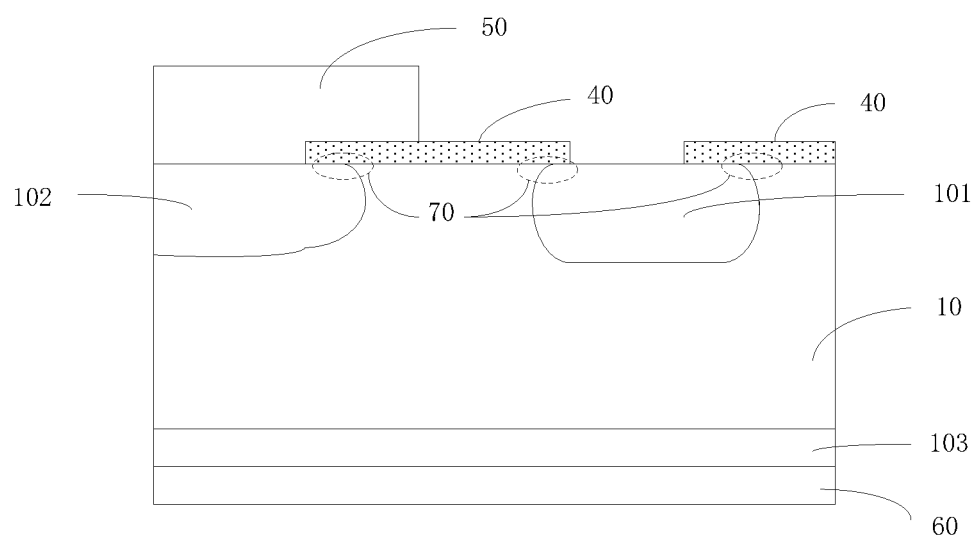
FIG. 1 is a structural schematic diagram illustrating a fast recovery diode in the prior art.
Figure 2:
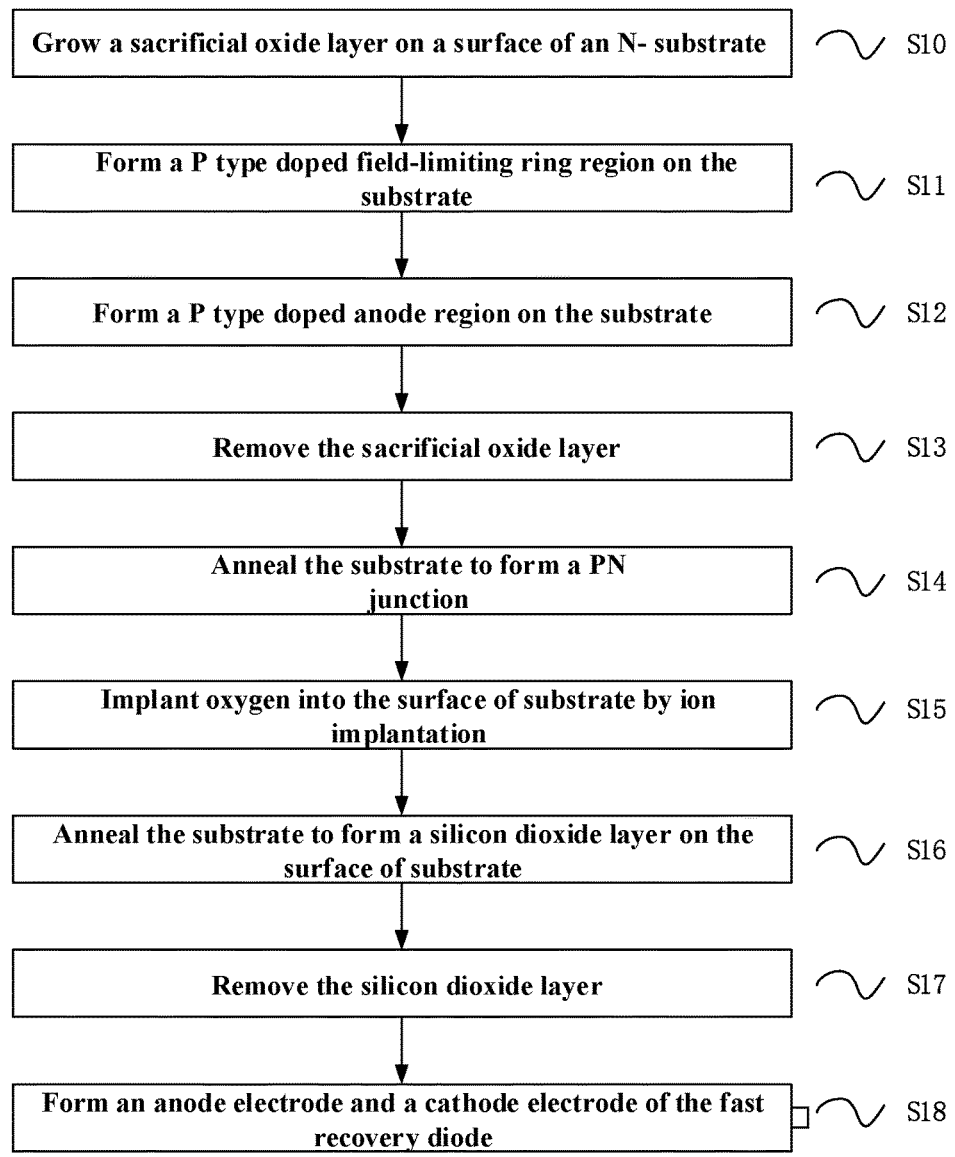
FIG. 2 is a schematic flow diagram of a fabrication method of fast recovery diode according to one embodiment of the present invention.

As shown in FIG. 2, the fabrication method of fast recovery diode according to one embodiment of the present invention includes the following process steps:

Step S10: growing a sacrificial oxide layer on a surface of an N− substrate.

Figure 3A:
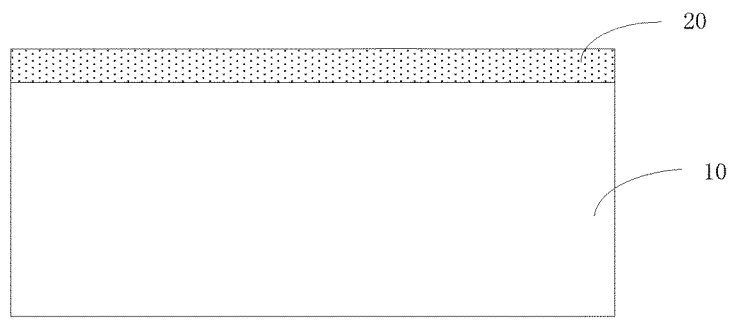
FIGS. 3A to 3H are structural schematic diagrams illustrating the fabrication method of fast recovery diode structure according to an embodiment of the present invention.

Specifically, the substrate is an N− silicon substrate 10, the sacrificial oxide layer 20 which is grown on the surface of the substrate has a thickness of from 200 Å to 500 Å, the device structure is shown in FIG. 3A.

Step S11: forming a P type doped field-limiting ring region on the substrate.

Figure 3B:
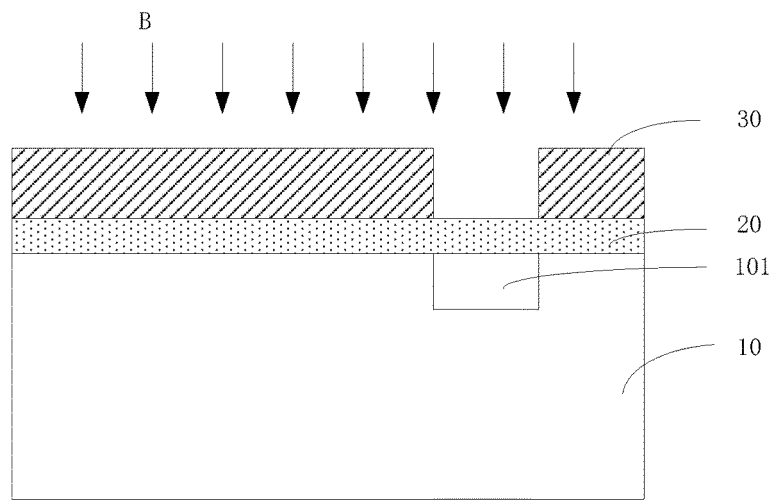

Specifically, applying a photoresist 30 to the N− substrate 10, defining a pattern of the field-limiting ring region by performing a first lithography, and implanting boron ions into the surface of the substrate 10, as shown in FIG. 3B; then removing the photoresist 30, so as to form the P type doped field-limiting ring region 101.

Further, the implant dose of the boron ions is from $1e14/cm^2$ to $1e15/cm^2$, the implant energy of the boron ions is from 60 KeV to 100 KeV.

Step S12: forming a P type doped anode region on the substrate.

Figure 3C:
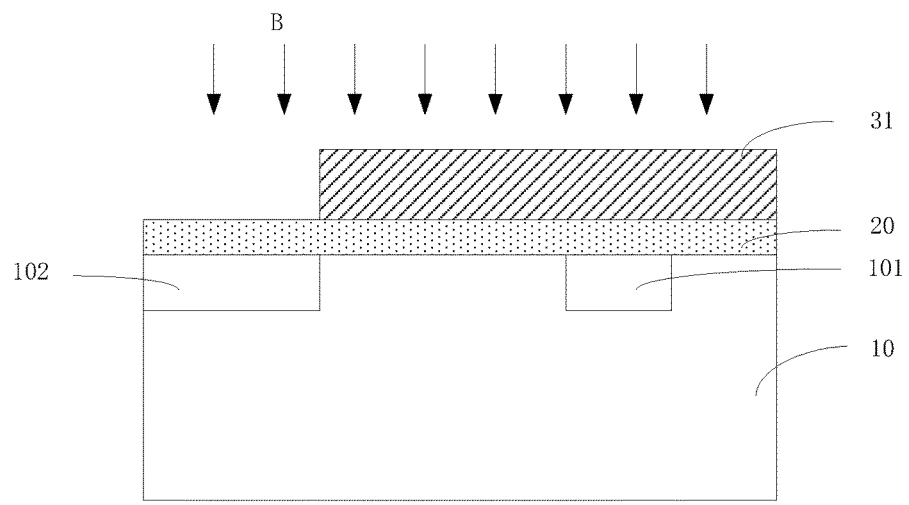

Specifically, applying a photoresist 31 to the N− substrate, defining a pattern of the anode region by performing a second lithography, and performing a boron ion implantation process, as shown in FIG. 3C; then removing the photoresist 31, so as to form the P type doped anode region 102.

Further, the implant dose of boron is from $1e12/cm^2$ to $8e12/cm^2$, the implant energy of the boron ions is from 60 KeV to 100 KeV.

Step S13: removing the sacrificial oxide layer 20.

Specifically, etching the surface of the N− substrate 10 using an HF-containing etchant, so as to remove the sacrificial oxide layer 20.

Step S14: annealing the substrate, to form a PN junction.

Figure 3D:
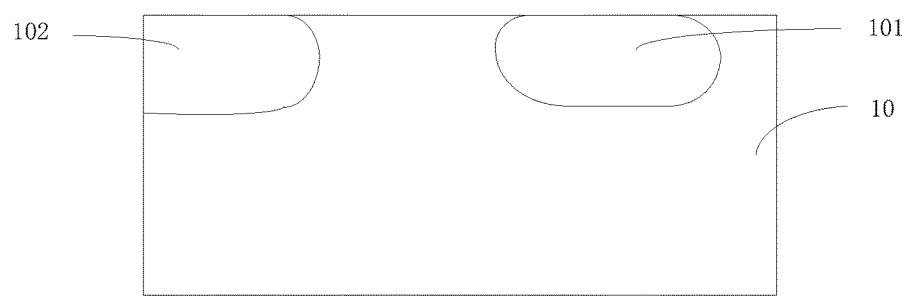

In this step the annealing temperature is about 1200 degrees Celsius, the annealing time is about 300 minutes, the annealing process enlarges the field-limiting ring region 101 and the anode region 102, the device structure at this step of the formed PN junction is shown in FIG. 3D, curved parts of the profile of the PN junction would be formed near the silicon surface, such curved parts would make the curvature radius of the PN junction smaller, which will cause an accumulation of electric field at the curved parts.

Step S15: implanting oxygen into the surface of the substrate by ion implantation.

Specifically, the implant dose of the oxygen is from $1e18/cm^2$ to $1e19/cm^2$, the implant energy of the oxygen is from 15 KeV to 150 KeV.

Step S16: annealing the substrate, to form a silicon dioxide layer 30 on the surface of the substrate.

Figure 3E:
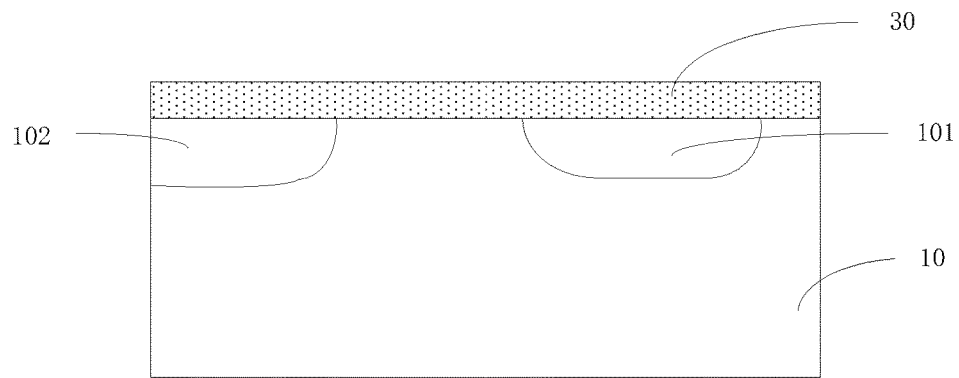

The annealing temperature is between 600 degrees Celsius and 1300 degrees Celsius, the annealing time is between 30 minutes and 300 minutes, the silicon on the surface of the substrate is oxidized, so as to form the silicon dioxide layer 30, the device structure at this step is shown in FIG. 3E.

Step S17: removing the silicon dioxide layer 30.

Figure 3F:
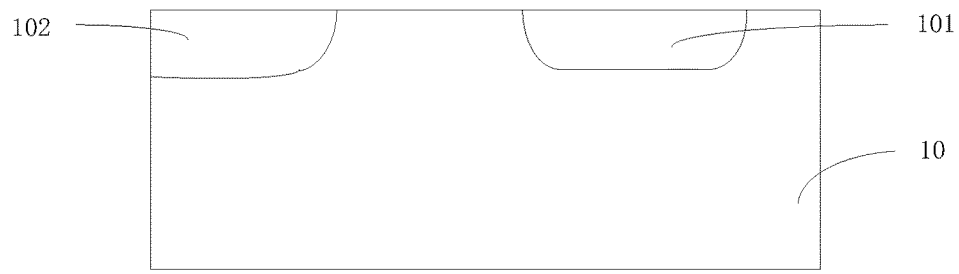

Specifically, etching the surface of the N− substrate 10 using an HF-containing etchant, so as to remove the silicon dioxide layer 30 formed on the substrate surface by the annealing process in the Step S16, the device structure at this step is shown in FIG. 3F.

After the Step S15, Step S16 and Step S17, compared with the device structure shown in FIG. 3D, it is found that the curved parts of the profile of PN junction are clearly eliminated.

Step S18: forming an anode electrode and a cathode electrode of the fast recovery diode.

Figure 3G:
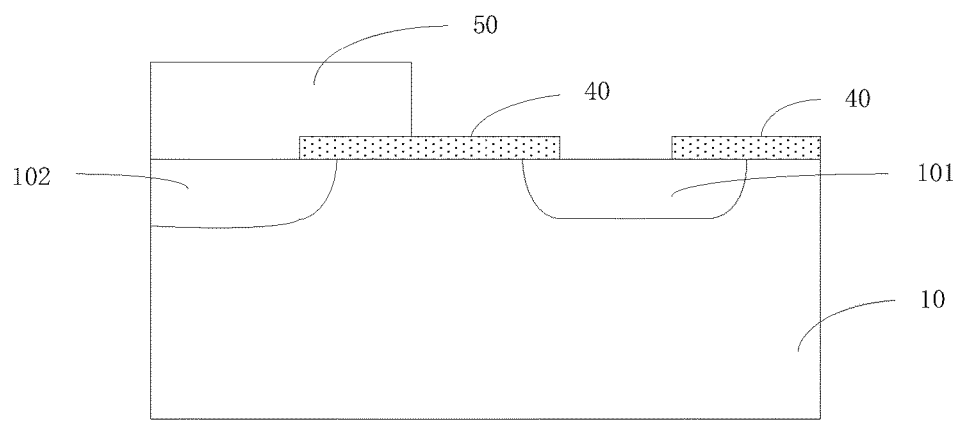
Figure 3H:
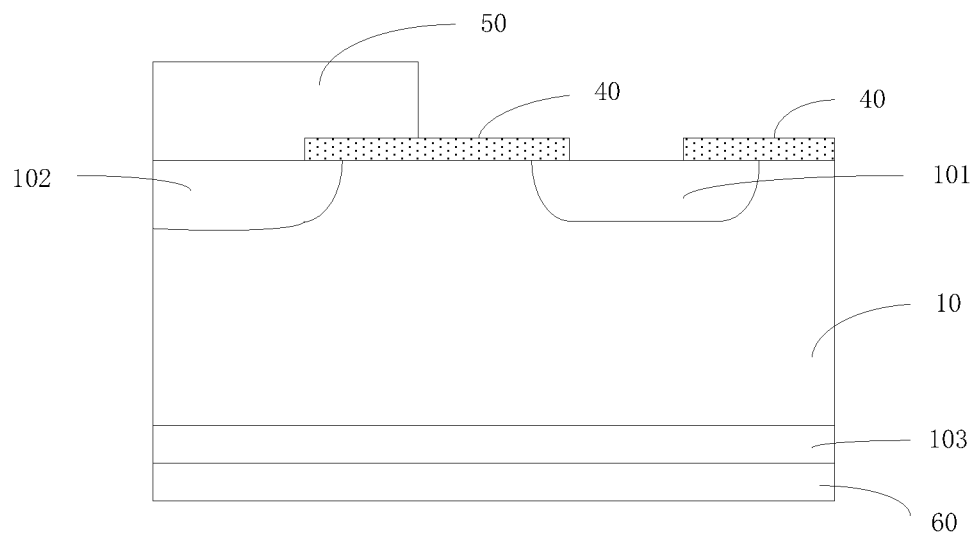

The Step S18 can include following sub-steps: 1) growing a field oxide layer 40 on the surface of the substrate; 2) defining a field-plate structure by patterning the field oxide layer; 3) depositing a first metal layer 50 on the surface of the substrate; 4) patterning the first metal layer 50 to form the anode of the fast recovery diode, the device structure at this sub step is shown in FIG. 3G; 5) grinding the backside of the substrate to a required thickness; 6) implanting phosphorus ions into the backside of the substrate and then annealing, so as to form an N+ doped region layer 103; 7) depositing a second metal layer 60 on the backside of the substrate, to form the cathode of the fast recovery diode, the device structure at this sub step is shown in FIG. 3H.

Specifically, in the above mentioned sub-step 1), growing a field oxide layer 40 on the surface of the substrate, the thickness of the field oxide layer is 15 kÅ, then forming a field oxide region by performing a third lithography process.

In the above mentioned sub-step 4), forming contact holes by performing a fourth lithography process and forming an anode electrode by performing a fifth lithography process, the contact holes are used to connect the first metal layer 50 and the anode region 102.

Further, the first metal layer 50 could forms a first metal region and a second metal region by performing a lithography process, the first metal region connects with the anode region 102 through the contact holes, so as to form the anode of the fast recovery diode finally; the second metal region connects with the field-limiting ring region 101, so as to form a metal ring on the field-plate.

In the above mentioned sub-step 7), the second metal layer 60 contact with the N+ doped region 103 at their faying surface to form a low resistance ohm-contact between N+ silicon and metal. The second metal layer 60 is formed by the backside metallization process, and acts as the cathode of the fast recovery diode, which can increase the electric conductivity of the fast recovery diode, and can enhance the heat dissipation effect of the fast recovery diode.

The above mentioned fabrication method of the fast recovery diode, through the steps such as implanting oxygen into the surface of the substrate by ion implantation, annealing the substrate to form a silicon dioxide layer on the surface of the substrate, and removing the silicon dioxide layer etc., the curved parts near the silicon surface of the profile of PN junction would be eliminated, the electric field intensity at the place would be decreased, therefore the breakdown voltage and reliability of the FRD device would be increased. This fabrication method is simple in operation, and easy to facilitate popularization and application in the industry.

It is understandable that, in the embodiments of the present invention, all of the steps such as forming the P type doped field-limiting ring region and the anode region, and the steps such as forming the anode electrode and the cathode electrode of the fast recovery diode can adopt any similar technologies in the prior art; as long as the fabrication method of the fast recovery diode includes the following steps: implanting oxygen, annealing to form a silicon dioxide layer, and removing the silicon dioxide layer to eliminate the curved parts of the profile of PN junction, which all shall be included in the protection scope of the present invention.

While this invention has been particularly shown and described with references to preferred embodiments thereof, it will be understood by those skilled in the art that various changes in form and details may be made herein without departing from the spirit and scope of the invention as defined by the appended claims.

The invention claimed is:

1. A fabrication method of fast recovery diode, comprising:
   a) growing a sacrificial oxide layer on a surface of an N− substrate;
   b) forming a P type doped field-limiting ring region on the substrate;
   c) forming a P type doped anode region on the substrate;
   d) removing the sacrificial oxide layer;
   e) annealing the substrate to form a PN junction;
   f) implanting oxygen into the surface of the substrate by ion implantation;
   g) annealing the substrate to form a silicon dioxide layer on the surface of the substrate;
   h) removing the silicon dioxide layer;
   i) forming an anode electrode and a cathode electrode of the fast recovery diode.

2. The fabrication method according to claim 1, wherein, in the Step f), the implant dose of the oxygen is between $1e18/cm^2$ and $1e19/cm^2$, the implant energy of the oxygen is between 15 KeV and 150 KeV.

3. The fabrication method according to claim 2, wherein, in the Step g), the annealing temperature is in a range of 600 degrees Celsius to 1300 degrees Celsius.

4. The fabrication method according to claim 1, wherein, in the Step a), the thickness of sacrificial oxide is between 200 Å and 500 Å.

5. The fabrication method according to claim 1, wherein, the Step b) specifically includes: defining a pattern of the field-limiting ring region on the substrate by performing a lithography process, then performing a boron ion implantation process, removing the photoresist, so as to form the P type doped field-limiting ring region.

6. The fabrication method according to claim 5, wherein, in the Step b), the implant dose of the boron ions is from $1e14/cm^2$ to $1e15/cm^2$, the implant energy of the boron ions is from 60 KeV to 100 KeV.

7. The fabrication method according to claim 1, wherein, the Step c) specifically includes: defining a pattern of the anode region on the substrate by performing a lithography process, then performing a boron ion implantation process, removing the photoresist, so as to form the P type doped anode region.

8. The fabrication method according to claim 7, wherein, in the Step c) the implant dose of the boron ions is from $1e12/cm^2$ to $8e12/cm^2$, the implant energy of the boron ions is from 60 KeV to 100 KeV.

9. The fabrication method according to claim 1, wherein, in the Step e), the annealing temperature is substantially 1200 degrees Celsius, the annealing time is substantially 300 minutes.

10. The fabrication method according to claim 1, wherein, the Step i) specifically includes following steps:
   i1) growing a field oxide layer on the surface of the substrate;
   i2) defining a field-plate structure by patterning the field oxide layer;
   i3) depositing a first metal layer;
   i4) patterning the first metal layer to form the anode of the fast recovery diode;
   i5) grinding the backside of the substrate to a required thickness;
   i6) implanting phosphorus ions into the backside of the substrate and then annealing, so as to form an N+ doped region layer;
   i7) depositing a second metal layer on the backside of the substrate, to form the cathode of the fast recovery diode.

* * * * *